United States Patent
Kwon et al.

(10) Patent No.: US 7,302,345 B2
(45) Date of Patent: Nov. 27, 2007

(54) METHOD AND APPARATUS FOR GENERATING MAGNETIC FIELD MAP AND METHOD AND APPARATUS FOR CHECKING POSE OF MOBILE BODY USING THE MAGNETIC FIELD MAP

(75) Inventors: Woong Kwon, Gyeonggi-do (KR); Kyung-shik Roh, Gyeonggi-do (KR); Woo-sup Han, Gyeonggi-do (KR); Young-bo Shim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 339 days.

(21) Appl. No.: 11/035,742

(22) Filed: Jan. 18, 2005

(65) Prior Publication Data
US 2005/0194973 A1    Sep. 8, 2005

(30) Foreign Application Priority Data
Feb. 4, 2004    (KR) .................... 10-2004-0007210

(51) Int. Cl.
G01V 3/38     (2006.01)
G01C 17/00    (2006.01)

(52) U.S. Cl. ........................ 702/5; 33/355 R
(58) Field of Classification Search ............ 702/5; 324/200, 260; 700/245; 701/1, 25; 33/355 R; 318/568.12; 901/1, 8
See application file for complete search history.

(56) References Cited

U.S. PATENT DOCUMENTS

| | | | | |
|---|---|---|---|---|
| 5,144,685 A | * | 9/1992 | Nasar et al. ............ | 382/153 |
| 5,677,836 A | * | 10/1997 | Bauer ....................... | 701/23 |
| 5,774,632 A | * | 6/1998 | Kaske ....................... | 706/25 |
| 5,937,398 A | * | 8/1999 | Maeda ...................... | 706/32 |
| 7,135,992 B2 | * | 11/2006 | Karlsson et al. ......... | 340/995.1 |

(Continued)

OTHER PUBLICATIONS

Foxlin, E. M., Generalized Architecture for Simultaneous Localization, Auto-Calibration, and Map-Building, Dec. 2002, Proceedings of the 2002 IEEE/RSJ Int'l Conference on Intelligent Robots and Systems, pp. 527-533.*

(Continued)

*Primary Examiner*—John Barlow
*Assistant Examiner*—Toan M. Le
(74) *Attorney, Agent, or Firm*—Buchanan Ingersoll & Rooney PC

(57) ABSTRACT

Provided is a method of generating a magnetic field map including obtaining magnetic field information, the magnetic field information being information on a magnetic field affecting a mobile body, for each position of the mobile body, and building a magnetic field map based on the magnetic field information for each position of the mobile body. The pose of a mobile body can be statistically checked by the probability obtained using the difference between the magnetic field information observed from the magnetic field map and the actually measured magnetic field information. Although the pose of the mobile body is estimated using a camera that is sensitive to an illumination state where the mobile body is placed, the pose of the mobile body can be relatively accurately checked using the magnetic field map obtained in a situation regardless of illumination, with being less affected by the illumination state where the mobile body is placed. Thus, the pose of the mobile body can be checked with reliability.

25 Claims, 14 Drawing Sheets

U.S. PATENT DOCUMENTS

2004/0249504 A1* 12/2004 Gutmann et al. ........... 700/245
2006/0180676 A1* 8/2006 Park et al. .................... 236/51

OTHER PUBLICATIONS

Rekleitis et al., Collaborative Exploration for Map Construction, Jul. 29-Aug. 1, 2001, Proceedings of 2001 IEEE Int'l Symposium on Computational Intelligence in Robotics and Automation, pp. 296-301.*

Anousaki et al., Simultaneous Localization and Map Building for Mobile Robot Navigation, Sep. 1999, IEEE Robotics & Automation Magazine, pp. 42-53.*

David Kortenkamp et al., "Topological Mapping for Mobile Robots Using a Combination of Sonar and Vision Sensing", Proceeding of the Twelfth National Conference on Artifical Intelligence, 1994, pp. 979-984.

Hans P. Moravec, "Sensor Fusion in Certainty Grids for Mobile Robots", AI Magazine, vol. 9, No. 2, 1988, pp. 61-74.

Dieter Fox et al., "Active Markov Localization for Mobile Robots", Robotics and Autonomous Systems, 1998, pp. 195-207.

Anthony R. Cassandra et al., Acting Under Uncertainty: Discrete Bayesian Models for Mobile-Robot Navigation, IEEE, 1996, pp. 963-972.

Sheng-Wu Liu et al., "A High Accuracy Magnetic Heading System Composed of Fluxgate Magnetometers and a Microcomputer", IEEE, 1989, pp. 148-152.

R. E. Kalman, "A New Approach to Linear Filtering and Prediction Problems", Journal of Basic Engineering, Mar. 1960, pp. 35-45.

Dieter Fox et al., "Markov Localization for Mobile Robots in Dynamics Environments", Journal of Artificial Intelligence Research, 199, pp. 391-427.

Michael K> Pitt et al., "Filtering via Simulation: Auxiliary Particle Filters", Journal of American Statistical Association, vol. 94, No. 446, Jun. 1999, pp. 590-599.

Stergios I. Roumeliotis et al., "Bayesian Estimation and Kalman Filtering: A Unified Framework for Mobile Robot Localization", IEEE, 2000, pp. 2985-2992.

* cited by examiner

▨ WALL

▨ 0.4 GAUSS OR MORE

◩ 0.33–0.4 GAUSS

⊞ 0.27–0.33 GAUSS

▦ 0.2–0.27 GAUSS

▢ 0.2 GAUSS OR LESS

☐ NOT EXPLORED

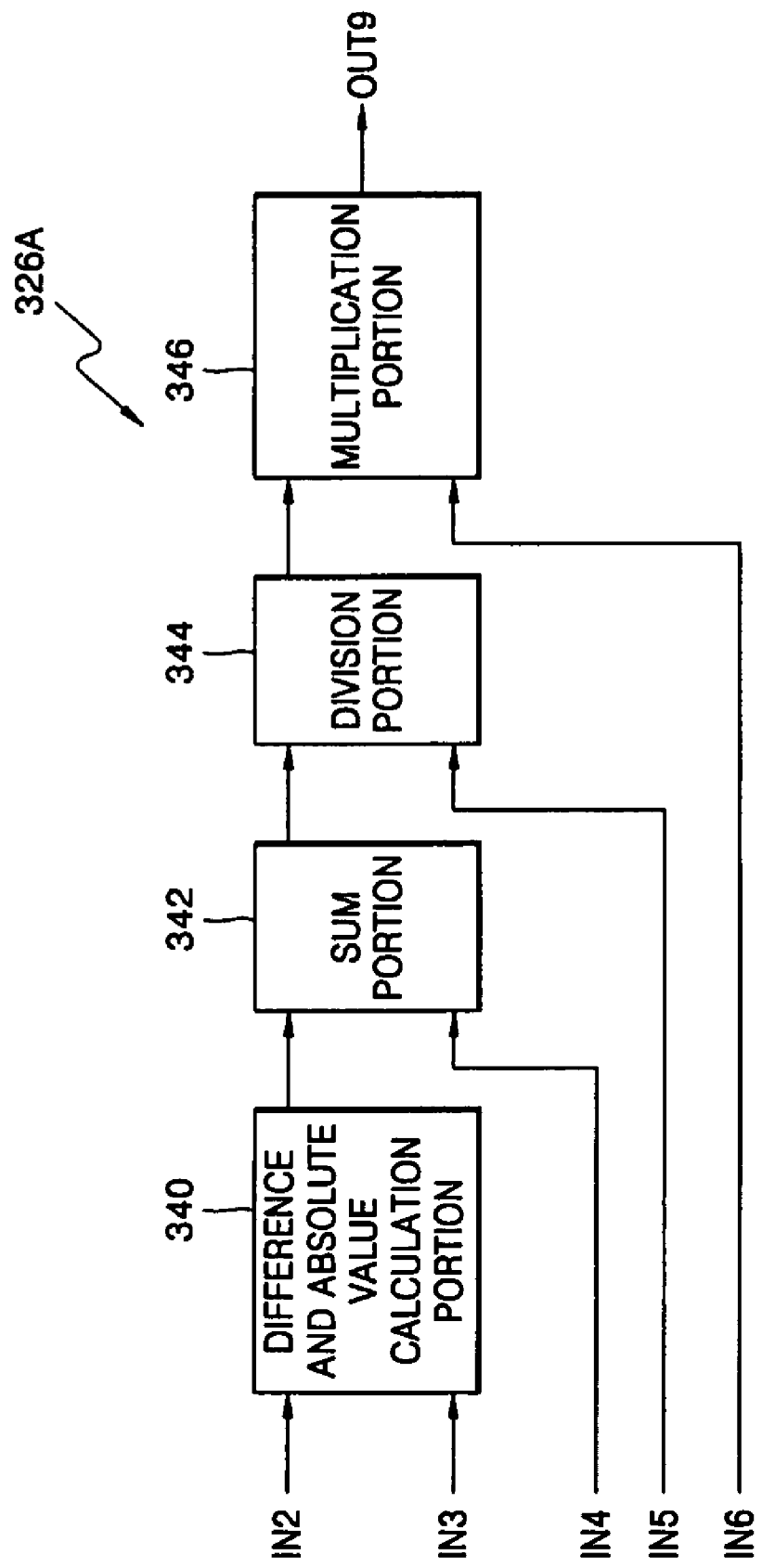

METHOD AND APPARATUS FOR GENERATING MAGNETIC FIELD MAP AND METHOD AND APPARATUS FOR CHECKING POSE OF MOBILE BODY USING THE MAGNETIC FIELD MAP

BACKGROUND OF THE INVENTION

Priority is claimed to Korean Patent Application No. 2004-7210, filed on Feb. 4, 2004, in the Korean Intellectual Property Office, the disclosure of which is incorporated herein in its entirety by reference.

1. Field of the Invention

The present invention relates to a mobile body such as a robot, and more particularly, to a method and apparatus for generating a magnetic field map containing information on a magnetic field affecting a mobile body and a method and apparatus for checking pose of a mobile body using a magnetic field map.

2. Description of the Related Art

A robot needs to accurately recognize its present position to control or monitor its movement. To this end, a map containing information on surrounding environment of the robot is needed.

A topological map method and a grid map method are conventional methods to provide a map. The topological map method is disclosed in a thesis entitled "Topological Mapping for Mobile Robots using a Combination of Sonar and Vision Sensing" written by D. Kortenkamp and T. Weymouth and published in 1994 in Proceedings of the Twelfth National Conference on Artificial Intelligence, at pages 979-984. Also, the grid map method is disclosed in a book entitled "Sensor Fusion in Certainty Grids for Mobile Robots" written by H. P. Moravec and published in 1988 by AI Magazine, vol. 9, no. 2, at pages 61-74.

The conventional topological map method represents the topological relationship among major landmarks in the surrounding environment of a robot as a map. Since the conventional topological map method does not use geometrical information, the conventional grid map method is mainly used to identify an accurate position of a robot.

According to the conventional grid map method, a space in which the robot moves is divided into grids having a certain size and a probability of occupying a grid is generated as a map using a sensor. That is, the conventional grid map method can approximately show the space occupied by a wall and obstacles around the robot using a sensor such as an ultrasonic sensor, an infrared ray scanner, a laser scanner, or a stereo camera. However, since the ultrasonic sensor and the infrared ray scanner have a large amount of noise, the result of sensing may be inaccurate. In addition, although the laser scanner may bring a relatively accurate result, it is expensive and may have a result distorted by a glass material. Moreover, since the stereo camera is sensitive to a change in illumination around the robot, a distorted result may be brought. Further, the stereo camera is not put to practical use because recognizing the landmarks through image processing is very difficult.

SUMMARY OF THE INVENTION

To solve the above and/or other problems, embodiments of the present invention provides a method of generating a magnetic field map containing information on surrounding environment of a mobile body using magnetic field information, that is information on a magnetic field affecting the mobile body.

Embodiments of the present invention provide a method of statistically checking pose of a mobile body using the above magnetic field map. A pose is typically composed of x position, y position, and orientation in two dimensional space.

Embodiments of the present invention provide an apparatus for generating a magnetic field map containing information on surrounding environment of a mobile body using magnetic field information that is information on a magnetic field affecting the mobile body.

Embodiments of the present invention provide an apparatus for statistically checking pose of a mobile body using the above magnetic field map.

According to an aspect of the present invention, a method of generating a magnetic field map comprises obtaining magnetic field information, the magnetic field information being information on a magnetic field affecting a mobile body, for each position of the mobile body, and building a magnetic field map based on the magnetic field information for each position of the mobile body.

According to another aspect of the present invention, a method of checking pose of a mobile body using the magnetic field map built by the method of generating a magnetic field map as described in the preceding paragraph, comprises after building the magnetic field map, estimating a position of the mobile body, obtaining a probability of pose of the mobile body existing at the estimated position, and adjusting the probability using both the magnetic field information expected at the estimated position on the magnetic field map and the magnetic field information actually measured at the estimated position, wherein the probability of the pose corresponds to at least one of a probability of the mobile body existing at the estimated position and a probability of the mobile body having an estimated direction. Consequently, the pose of the mobile body is checked through the adjusted probability.

According to another aspect of the present invention, an apparatus for generating a magnetic field map comprises a magnetic field information calculation portion calculating magnetic field information, the magnetic filed information being information on a magnetic field affecting a mobile body, for each position of the mobile body, and a magnetic field map building portion building a magnetic field map based on the magnetic field information for each position of the mobile body output from the magnetic field information calculation portion.

According to another aspect of the present invention, an apparatus for checking pose of a mobile body using the magnetic field map generated by the apparatus for generating the magnetic field map as described in the preceding paragraph, comprises a position estimation portion estimating a position of the mobile body, a probability calculation portion calculating a probability of pose of the mobile body existing at the estimated position, a magnetic field information measurement portion measuring the magnetic field information at the estimated position, and a probability adjustment portion adjusting the probability using magnetic field information expected at the estimated position on the magnetic field map and actually measured magnetic field information output from the magnetic field information measurement portion, wherein the probability of pose corresponds to at least one of a probability of the mobile body existing at the estimated position and a probability of the mobile body having an estimated direction. Consequently, the pose of the mobile body is checked through the adjusted probability.

BRIEF DESCRIPTION OF THE DRAWINGS

The above and other features and advantages of the present invention will become more apparent by describing in detail preferred embodiments thereof with reference to the attached drawings in which:

FIG. 18 is a block diagram of an embodiment of the probability adjustment portion shown in FIG. 17.

DETAILED DESCRIPTION OF THE INVENTION

Figure 1:
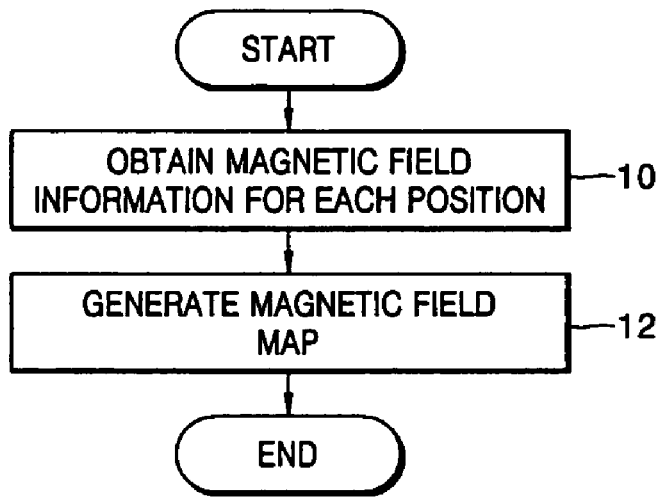
FIG. 1 is a flow chart for explaining a method of generating a magnetic field map according to an embodiment of the present invention.

Referring to FIG. 1, a method of generating a magnetic field map according to an embodiment of the present invention includes obtaining magnetic field information for each position and generating a magnetic field map using the obtained magnetic field information (Steps 10 and 12).

In FIG. 1, information on a magnetic field affecting a mobile body (hereinafter, "magnetic field information") is obtained for each position of the mobile body (Step 10). Here, the mobile body means a moving object such as a moving robot. Hereinafter, the magnetic field information means at least one of the magnitude of a magnetic field affecting the mobile body and the direction of a magnetic north (or south) thereof. If the mobile body is a robot having a magnetic compass, at least one of the magnitude of a magnetic field and the direction of a magnetic north (or south) thereof can be measured using the magnetic compass. For example, the respective components of a magnetic field vector are measured using the magnetic compass, and the magnitude of a magnetic field can be obtained using the measured components.

After Step 10, a magnetic field map is built in which the position and the magnetic field information obtained for each position of the mobile body are matched (Step 12).

Figure 2:
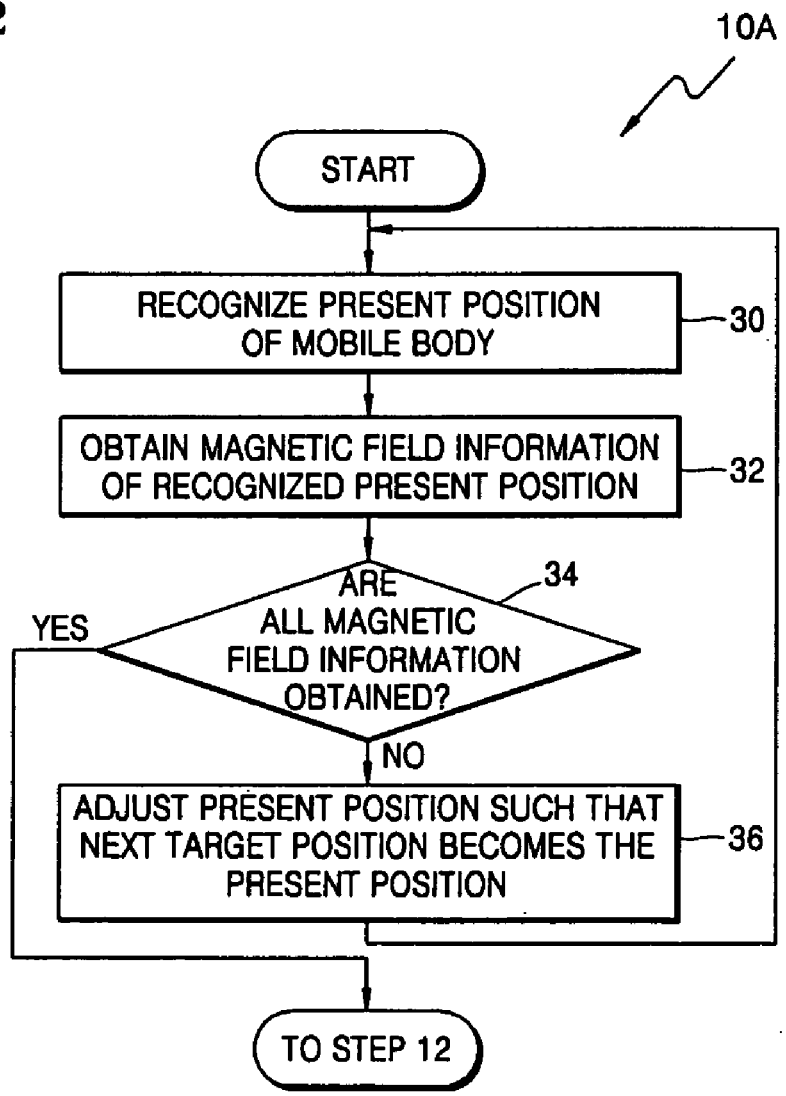
FIG. 2 is a flow chart for explaining Step 10 shown in FIG. 1 according to an embodiment of the present invention.

FIG. 2 is a flow chart for explaining Step 10 shown in FIG. 1 according to an embodiment (10A) of the present invention, in which magnetic field information of all possible positions on a magnetic field map is obtained one by one (Steps 30-36). Referring to FIG. 2, the present position of a mobile body is recognized (Step 30). After Step 30, magnetic field information is obtained at the recognized present position and the obtained magnetic field information is matched with the recognized present position so that the matched magnetic field information is stored (Step 32). After Step 32, whether all magnetic field information with respect to all positions on the magnetic field map is obtained is determined (Step 34). If it is determined that all magnetic field information with respect to all positions on the magnetic field map are obtained, the method proceeds to Step 12. However, if it is determined that all magnetic field information with respect to all positions on magnetic field map is not obtained, the present position is adjusted such that the next target position becomes the present position and the method proceeds to Step 30 (Step 36). Thus, after Step 36, the next target position is recognized as the present position (Step 30).

Figure 3:
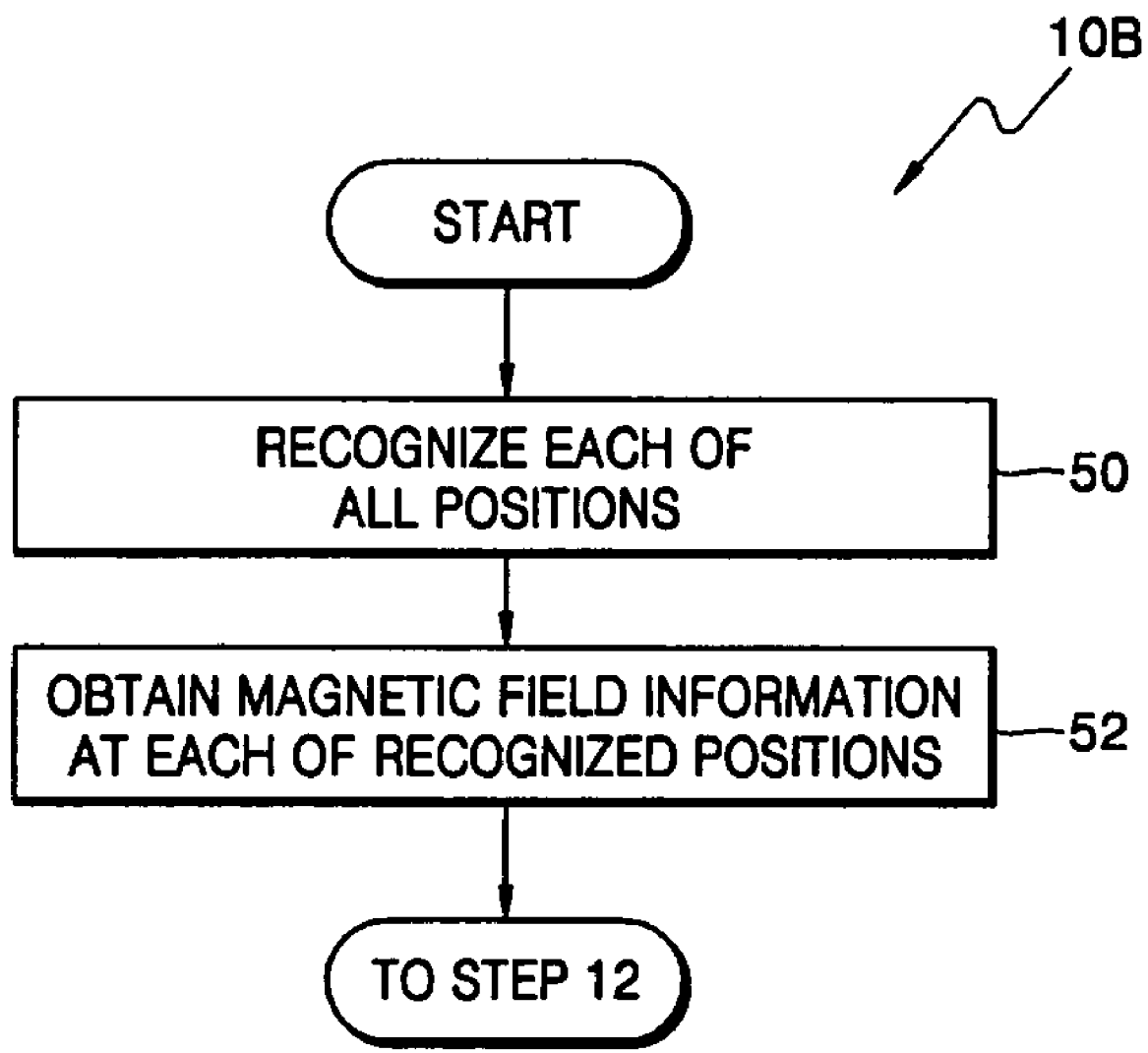
FIG. 3 is a flow chart for explaining Step 10 shown in FIG. 1 according to another embodiment of the present invention.

FIG. 3 is a flow chart for explaining Step 10 shown in FIG. 1 according to another embodiment (10B) of the present invention, in which all magnetic field information with respect to all positions on a magnetic field map are simultaneously obtained (Steps 50 and 52).

Referring to FIG. 3, each of all positions on the magnetic field map is recognized (Step 50). After Step 50, magnetic field information is obtained at each of the recognized positions, the obtained magnetic field information for each position is stored, and the method proceeds to Step 12 (Step 52).

In the embodiment 10A shown in FIG. 2, magnetic field information of all positions existing on the magnetic field map are obtained one by one and stored for each position. In contrast, in the embodiment 10B shown in FIG. 3, all magnetic field information of all positions existing the magnetic field map are simultaneously obtained and stored for each position.

Figure 4:
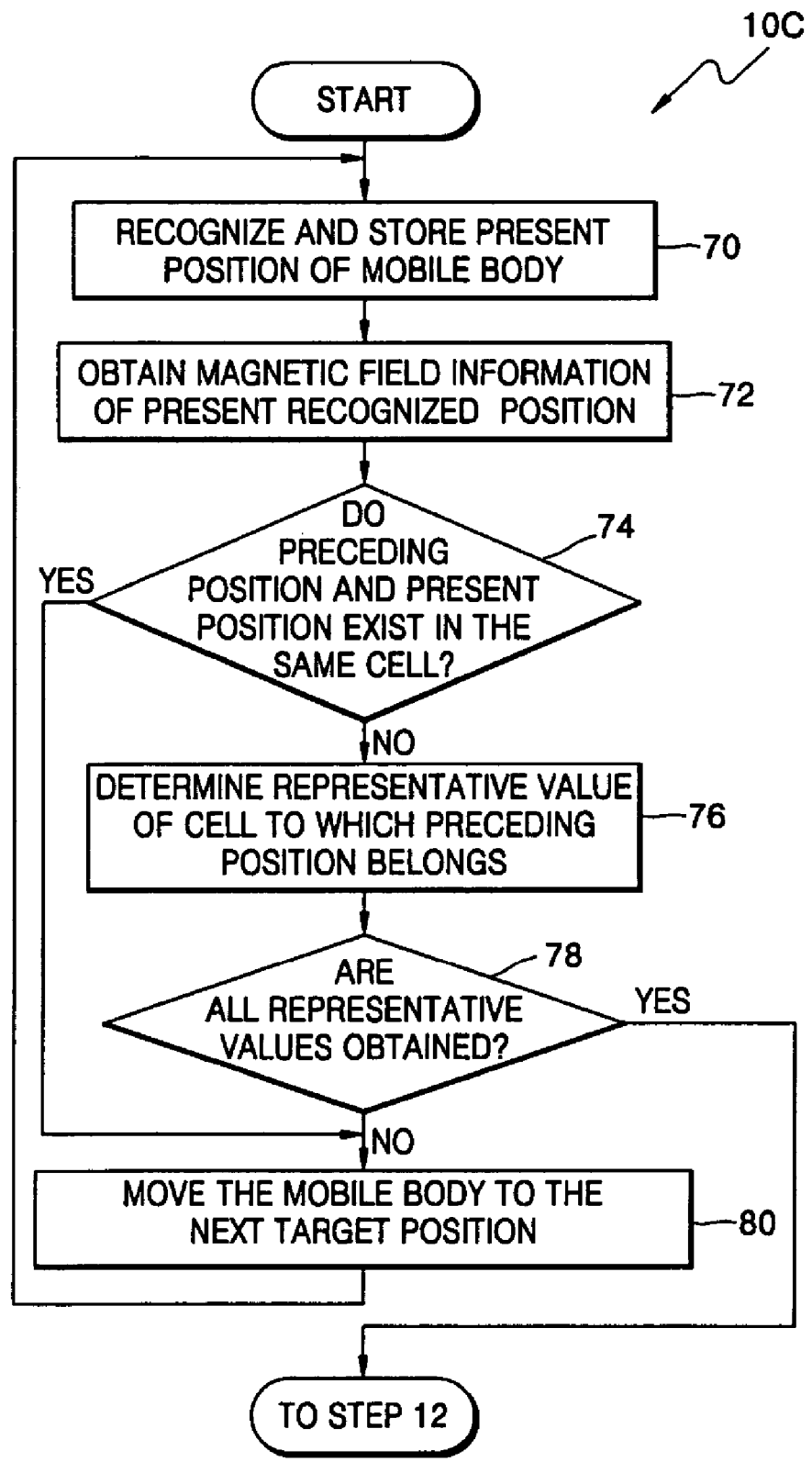
FIG. 4 is a flow chart for explaining Step 10 shown in FIG. 1 according to yet another embodiment of the present invention.

FIG. 4 is a flow chart for explaining Step 10 shown in FIG. 1 according to yet another embodiment (10C) of the present invention, in which magnetic field information on all cells of the magnetic field map is obtained one-by-one (Steps 70-80).

Figure 5:
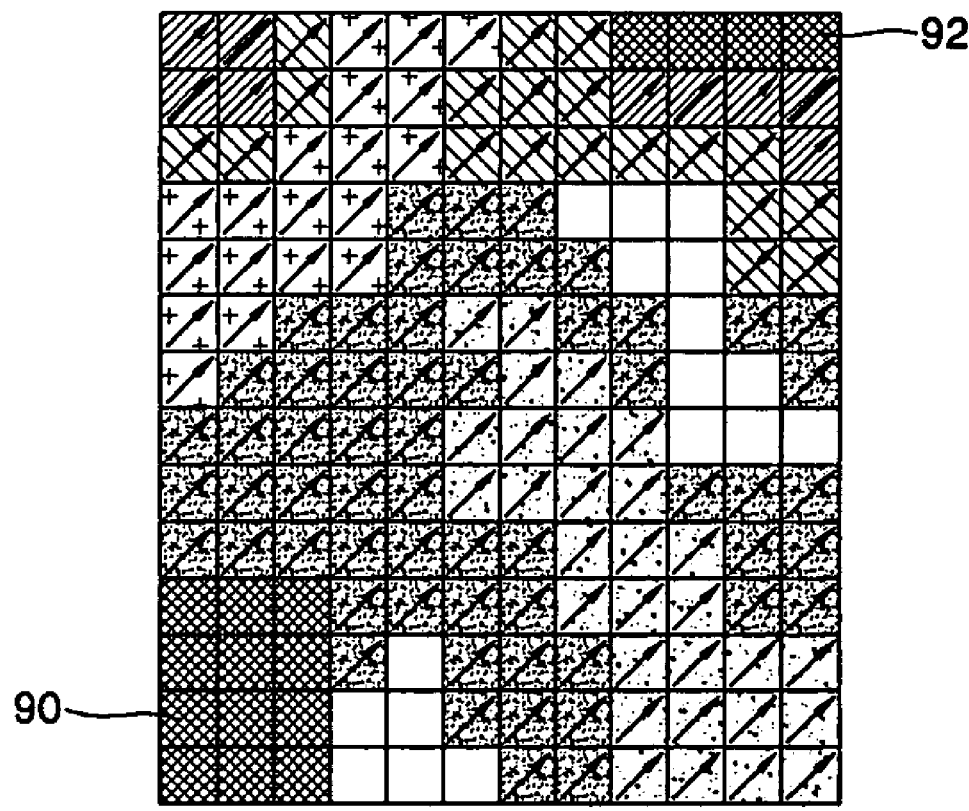
FIG. 5 is a view illustrating an example of a magnetic field map.

FIG. 5 is an example of a magnetic field map obtained by making a mobile body explore in an indoor space where walls 90 and 92 exist, which includes a plurality of cells or grids. Each cell is defined by dividing the entire map into equal sized areas. Here, an arrow of each cell denotes the estimated direction of the magnetic north and a cell with no magnetic field information denotes a region where the mobile body does not explore.

When a mobile body explores to build a magnetic field map, the present position of the mobile body is recognized and stored at first (Step 70). After Step 70, magnetic field information at the presently recognized position of the mobile body is obtained and stored (Step 72). After Step 72, whether the present position and a preceding position, visited and recognized just before the present position is recognized exist in the same cell is determined (Step 74). Here, each cell includes one or more positions. If it is determined that the present position and the preceding position of the mobile body exist in the same cell, the mobile body moves to the next target position and the method proceeds to Step 70 (Step 80). After Step 80, the next target position is regarded as the present position in Step 70. However, if it is determined in Step 74 that the present position and the preceding position of the mobile body do not exist in the same cell, that is, if it is determined that all magnetic field information on all positions included in the cell to which the preceding position belongs are obtained, the representative values of the magnetic field information of the positions included in the cell to which the preceding position belongs are determined (Step 76). Here, the determined representative value is stored for each cell.

After Step 76, whether all representative values with respect to all cells of the magnetic field map are obtained is determined (Step 78). If all representative values with respect to all cells of the magnetic field map are not obtained, the method proceeds to Step 80. However, if it is determined that all representative values with respect to all cells of the magnetic field map are obtained, the method proceeds to Step 12. Here, the magnetic field map is generated by the representative value for each cell (Step 12).

Figure 6:
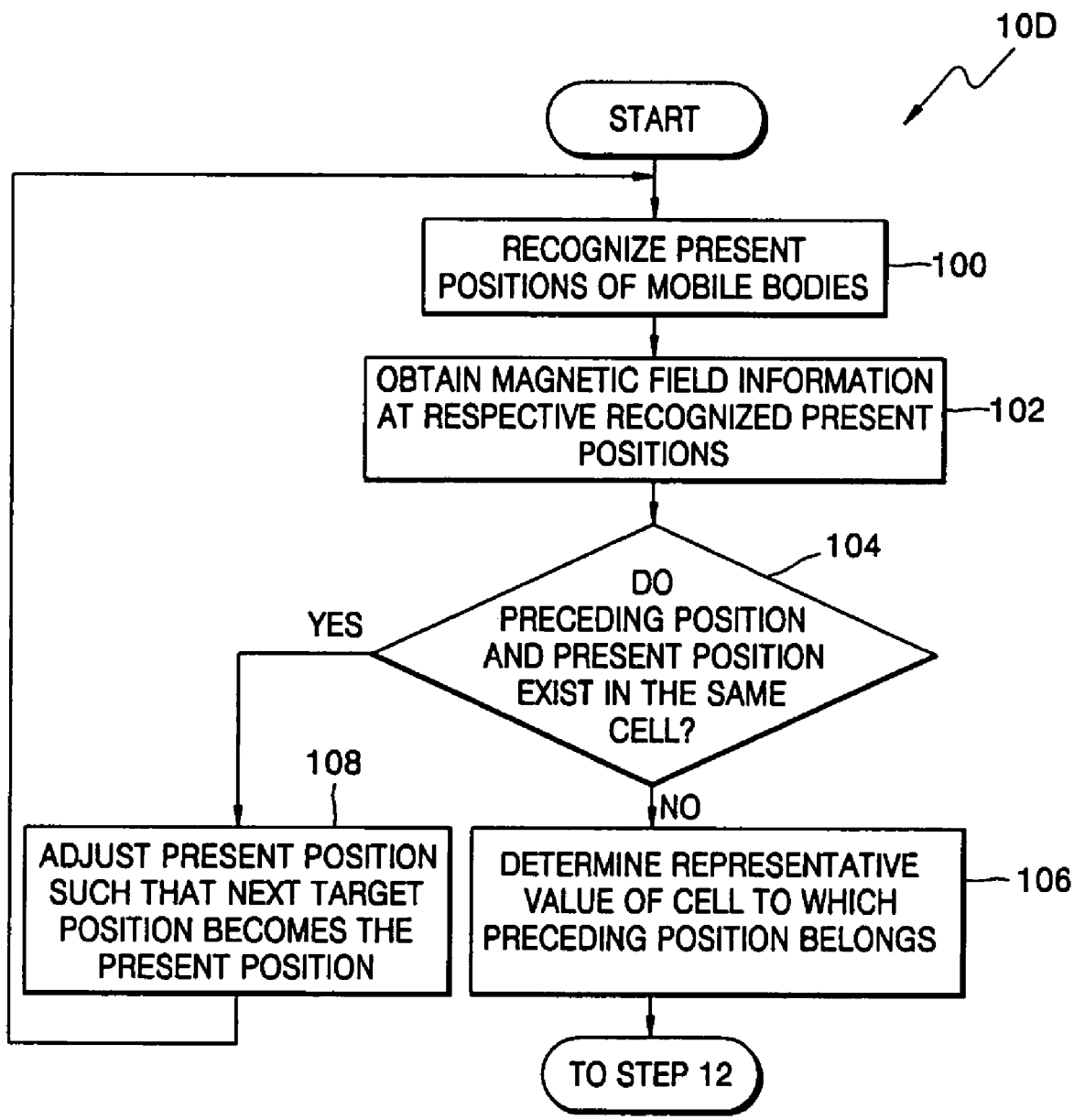
FIG. 6 is a flow chart for explaining Step 10 shown in FIG. 1 according to still yet another embodiment of the present invention.

FIG. 6 is a flow chart for explaining Step 10 shown in FIG. 1 according to still yet another embodiment (10D) of the present invention, in which all magnetic field information on all cells of the magnetic field map are simultaneously obtained (Steps 100-108). Steps 100-108 shown in FIG. 6 are simultaneously performed with respect to all cells of the magnetic field map.

The present positions of the mobile bodies, the number of which is the same as the number of cells capable of existing in the magnetic field map, are recognized (Step 100). After Step 100, magnetic field information at each of the recognized present positions is obtained and stored (Step 102). After Step 102, whether the present position and a preceding position, recognized just before the present position is recognized, exist in the same cell is determined (Step 104).

If it is determined that the present position and the preceding position of the mobile body do not exist in the same cell, the representative values of the magnetic field information of the positions included in the cell to which the preceding position belongs are determined and the method proceeds to Step 12 (Step 106). The determined representative value is stored for each cell. A magnetic field map is generated by the representative value stored for each cell (Step 12).

However, if it is determined that the present position and the preceding position exist in the same cell, each of present positions is adjusted such that the corresponding next target position becomes the present position and the method proceeds to Step 100 (Step 108). After Step 108, the next target position is regarded as the present position (Step 100).

According to an embodiment of the present invention, in Step 76 of FIG. 4 or Step 106 of FIG. 6, the average of the magnetic field information of the positions included in each cell can be determined as a representative value of the magnetic field map of the cell. If the magnetic field information is the magnitude of a magnetic field, the average of magnitudes of magnetic fields of the positions included in the cell to which the preceding position belongs can be determined as a representative value of the magnitude of the magnetic field of the cell. Likewise, if the magnetic field information is the direction of a magnetic north, the average of the directions of the magnetic north of the positions included in the cell to which the preceding position belongs can be determined as a representative value of the direction of the magnetic north of the cell in these exemplary embodiments.

According to another embodiment of the present invention, in Step 76 of FIG. 4 or Step 106 of FIG. 6, when the magnetic field information is divided into a plurality of sections, the section to which the magnetic field information of the positions included in each cell belongs can be determined as a representative value of the cell. If the magnetic field information is the magnitude of a magnetic field, the magnitude of a magnetic field can be represented in a plurality of sections, for example, as shown in FIG. 5, a section of 0.4 Gauss or more, a section of 0.33-0.4 Gauss, a section of 0.27-0.33 Gauss, a section of 0.2-0.27 Gauss, and a section of 0.2 Gauss or less. Here, the section to which the magnitudes of the magnetic fields of the positions included in the cell, to which the preceding position belongs, belong is selected and the selected section can be determined as a representative value of the magnitude of the magnetic field of the cell. Likewise, the magnetic field information is the direction of a magnetic north, the direction of a magnetic north is divided into a plurality of sections. The section to which the directions of magnetic north of the positions included in the cell, to which the preceding position belongs, belong is selected, and the selected section can be determined as a representative value of the direction of a magnetic north of the cell, for example. For example, a representative value of the magnitude of a magnetic field of each cell can be represented as the sections as shown in FIG. 5.

Consequently, when a magnetic field map is divided into a plurality of cells, the representative values of all cells on the magnetic field map are obtained one by one in the embodiment 10C of FIG. 4. On the contrary, in the embodiment 10D of FIG. 6, the representative values of all cells on the magnetic field map are obtained at the same time.

According to embodiments of the present invention, the present position of the mobile body recognized in each of Steps 30, 50, 70, and 100 shown in FIGS. 2, 3, 4, and 6, respectively, can be estimated. In this case, in Step 36, 80, or 108 shown in FIG. 2, 4, or 6, respectively, the adjustment of the present position to the next target position means making the mobile body travel from the present position to the next target position. Here, to estimate the present position, a sensor such as a camera, an ultrasonic sensor, a gyro sensor, an odometer, a laser scanner, or an infrared ray scanner can be used.

Alternatively, the present position of the mobile body recognized in each of Steps 30, 50, 70, and 100 shown in FIGS. 2, 3, 4, and 6, respectively, can be given in advance. In this case, in Step 36, 80, or 108 shown in FIG. 2, 4, or 6, respectively, the adjustment of the present position to the next target position means transferring the mobile body, without making the mobile body travel, from the present position to the next target position.

The next target position mentioned in Step 36, 80, or 108 shown in FIG. 2, 4, or 6, respectively, can be determined in an active Markov localization method or a partially observable Markov decision process (POMDP). Here, the active Markov localization method is disclosed in a thesis entitled "Active Markov Localization for Mobile Robots" (D. Fox, W. Burgard, and S. Thrun, Robotics and Autonomous Systems, v. 25, 1998, pp. 195-207). The partially observable Markov decision process (POMDP) is disclosed in a thesis entitled "Acting under Uncertainty: Discrete Bayesian Models for Mobile Robot Navigation" (L. P. Kaelbling, A. R. Cassandra, and J. A. Kurien, in Proceedings of the IEEE/RSJ International Conference on Intelligent Robots and Systems, 1996), herein incorporated by reference.

For example, the method of obtaining the magnetic field information in Step 32, 52, 72, or 102 shown in FIG. 2, 3, 4, or 6 is disclosed in a thesis entitled "A High Accuracy of Magnetic Heading System Composed of Fluxgate Magnetometers and a Microcomputer" (S. Liu, Z. Zhang, J. C. Hung, in Proceedings of IEEE 1989 National Aerospace and Electronics Conference (NAECON89), 1989, pp. 148-152), herein incorporated by reference.

The method of checking pose of a mobile body using a magnetic field map and the embodiment thereof, according to embodiments of the present invention, are described below with reference to the accompanying drawings.

Figure 7:
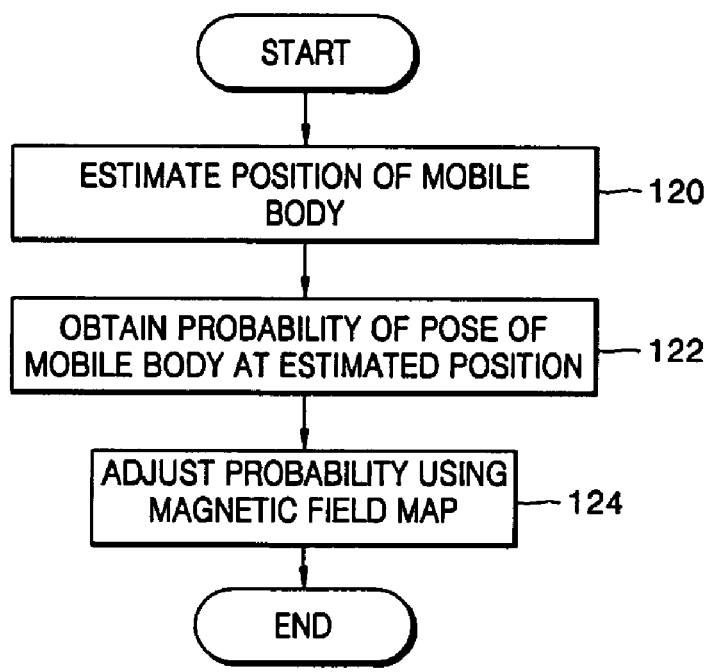
FIG. 7 is a flow chart for explaining a method of checking pose of a mobile body using the magnetic field map according to an embodiment of the present invention.

FIG. 7 is a flow chart for explaining a method of checking pose of a mobile body using the magnetic field map according to an embodiment of the present invention, in which the position of a mobile body is estimated (Step 120) and the probability of pose of the mobile body at an estimated position is determined using the magnetic field map (Steps 122 and 124).

After Step 12 shown in FIG. 1, the position of a mobile body of which pose is to be checked is estimated (Step 120). After Step 120, the probability of pose of the mobile body is obtained at an estimated position of the mobile body (Step 122). Here, the probability of pose of the mobile body means at least one of a probability of the mobile body existing at the estimated present position and a probability of the mobile body maintaining the present direction.

The method of estimating the present position of a mobile body in each of Steps 30, 50, 70, 100, and 120 and the method of obtaining the probability of pose of a mobile body in Step 122, respectively shown in FIGS. 2, 3, 4, 6, and 7, may be performed, for example, using a Kalman filter, a Markov localization method, a particle filter, or a multiple hypothesis localization method.

The Kalman filter is disclosed in a thesis entitled "A New Approach to Linear Filtering and Prediction Problems" (R. E. Kalman, Transactions of ASME—Journal of Basic Engineering, 1960, v. 82, pp. 35-45), herein incorporated by reference. The Markov localization method is disclosed in a thesis entitled "Markov Localization for Mobile Robots in Dynamic Environments" (D. Fox, W. Burgard, and S. Thrun, Journal of Artificial Intelligence Research, 1999, v.11, pp. 391-427), herein incorporated by reference. The particle filter is disclosed in a thesis entitled "Filtering via Simulation: Auxiliary Particle Filter" (M. Pitt and N. Shephard, Journal of the American Statistical Association, 1999, 94, pp. 590-599), herein incorporated by reference. The multiple hypothesis localization method is disclosed in a thesis entitled "Bayesian Estimation and Kalman Filtering: A Unified Framework for Mobile Robot Localization" (S. I. Roumeliotis and G. A. Bekey, in Proceedings of the IEEE International Conference on Robotics and Automation, 2000, pp. 2985-2992), herein incorporated by reference.

If the present position of the mobile body is estimated by a Kalman filter, probability of pose of the mobile body is analogized from covariance information. However, when the present position of the mobile body is estimated using the Markov localization method, the particle filter, or the multiple hypothesis localization method, the probability of pose of the mobile body needs to be obtained directly.

After Step 122, the probability is adjusted using magnetic field information expected at a position estimated on the magnetic field map and magnetic field information actually measured at the estimated position (Step 124). According to embodiments of the present invention, the actual magnetic field information at the estimated present position can be measured at Step 120 or Step 124. The pose of the mobile body can be identified through the adjusted probability.

Figure 8:
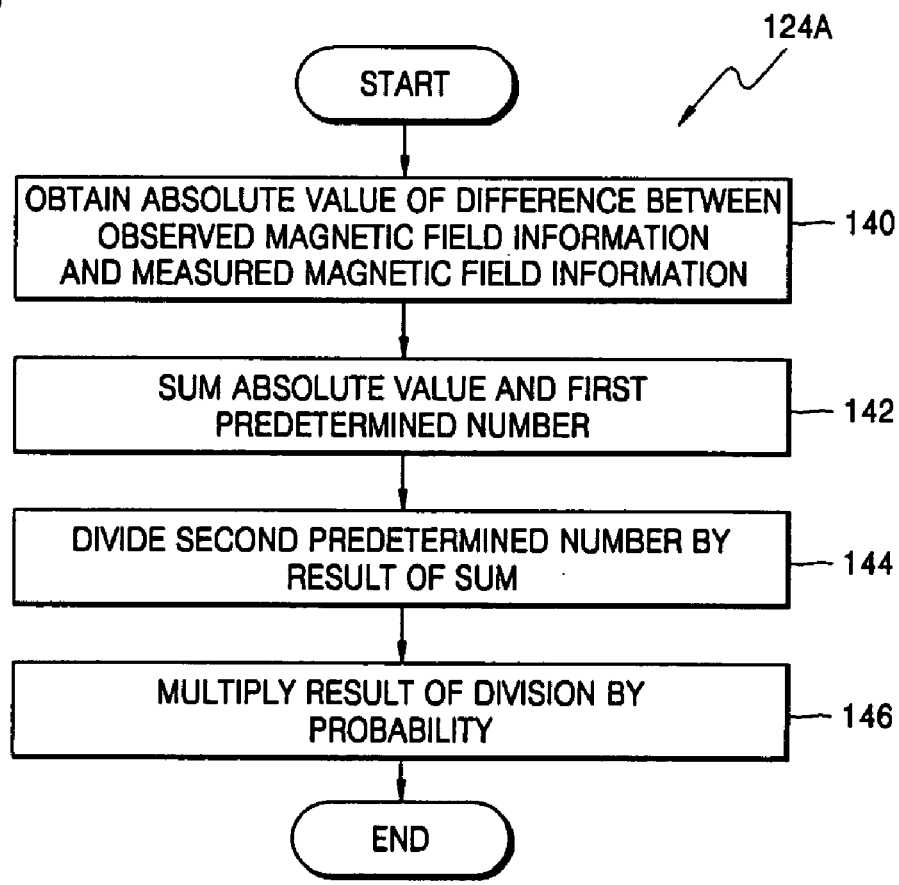
FIG. 8 is a flow chart for explaining Step 124 shown in FIG. 7 according to an embodiment of the present invention.

FIG. 8 is a flow chart for explaining Step 124 shown in FIG. 7 according to an embodiment (124A) of the present invention, in which probability is adjusted using a difference between the observed magnetic field information and the measured field information and first and second predetermined numbers (Steps 140-146).

After Step 122, an absolute value of the difference between the observed magnetic field information and the measured magnetic field information is obtained (Step 140). After Step 140, the absolute value of the difference and the first predetermined number are summed (Step 142). The first predetermined number can be predetermined such that the result of the sum in Step 142 can be a positive number.

After Step 142, the second predetermined number is divided by the result of sum (Step 144). The second predetermined number can be obtained empirically.

After Step 144, the probability P obtained at Step 122 and the result of division are multiplied, and the result of multiplication is determined as an adjusted probability P' (Step 146). The adjusted probability P' can be expressed as shown in Equations 1 or 2.

$$P' = P \cdot \frac{K'}{|H_r - H_m| + \varepsilon} \quad \text{[Equation 1]}$$

$$P' = P \cdot \frac{K'}{|\theta_r - \theta_m| + \varepsilon} \quad \text{[Equation 2]}$$

Here, $\varepsilon$ denotes the first predetermined number, $K'$ denotes the second predetermined number, $H_m$ denotes the magnitude of a magnetic field expected at the estimated position on the magnetic field map, $H_r$ denotes the magnitude of a magnetic field measured at the estimated position, $\theta_m$ denotes the direction of a magnetic north expected at the estimated position on the magnetic field map, and $\theta_r$ denotes the direction of a magnetic north measured at the estimated position.

As can be seen from Equations 1 or 2, as the difference between the observed magnitude of the magnetic field and the measured magnitude of the magnetic field decreases, the adjusted probability P' increases, which means at least one of a high possibility of the mobile body existing at the estimated present position and a high possibility of the mobile body maintaining the present direction. In contrast, as the difference between the observed magnitude of the magnetic field and the measured magnitude of the magnetic field increases, the adjusted probability P' decreases, which means at least one of a low possibility of the mobile body existing at the estimated present position and a low possibility of the mobile body maintaining the present direction.

Figure 9:
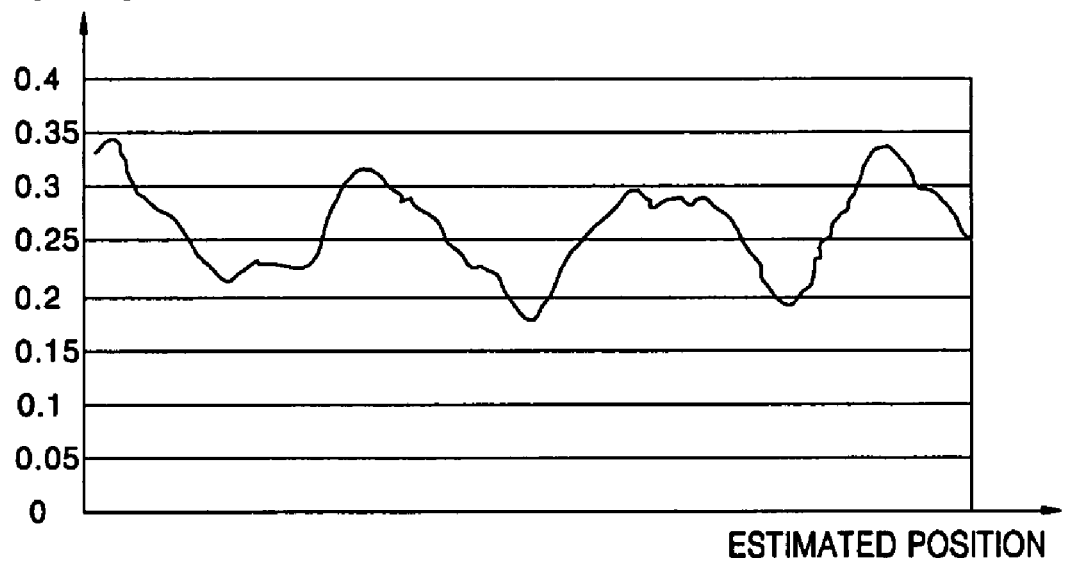
FIG. 9 is a graph showing the relationship between the magnitude of a magnetic field and an estimated position while the mobile body moves in a one dimensional space.

FIG. 9 is a graph showing and example of the relationship between the magnitude of a magnetic field and an estimated position while the mobile body moves in a one dimensional space. In the graph, a horizontal axis indicates the estimated position of the mobile body while a vertical axis indicates the magnitude of a magnetic field measured at the estimated position.

Figure 10:
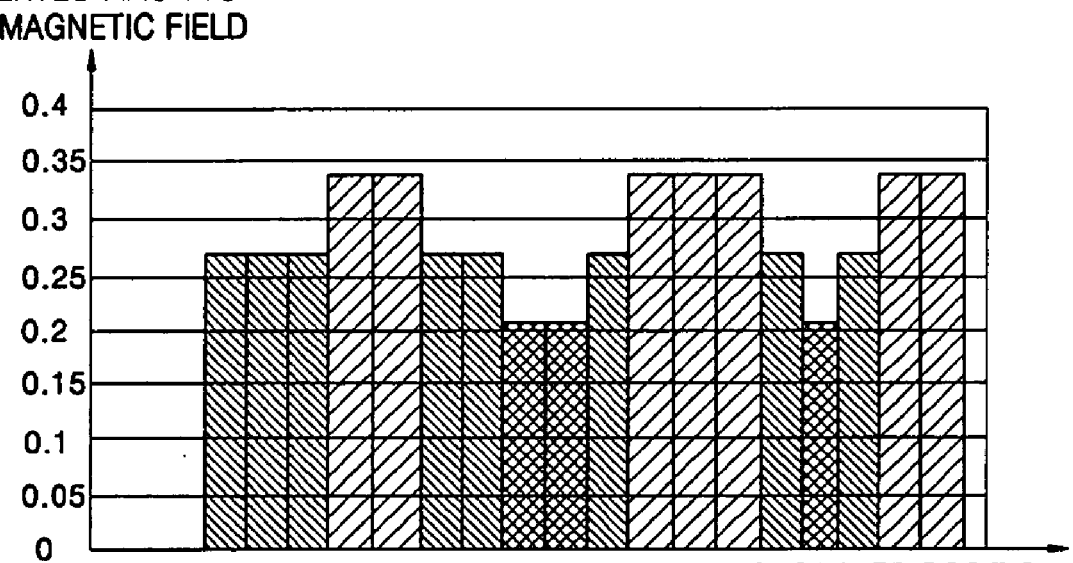
FIG. 10 is a graph showing the relationship between the magnitude of a magnetic field and the position of a mobile body observed on a one dimensional magnetic field map.

FIG. 10 is a graph showing an example of the relationship between the magnitude of a magnetic field and the position of a mobile body observed on a one dimensional magnetic field map. In the graph, a horizontal axis indicates the observed position of the mobile body while a vertical axis indicates the observed magnitude of a magnetic field.

Figure 11:
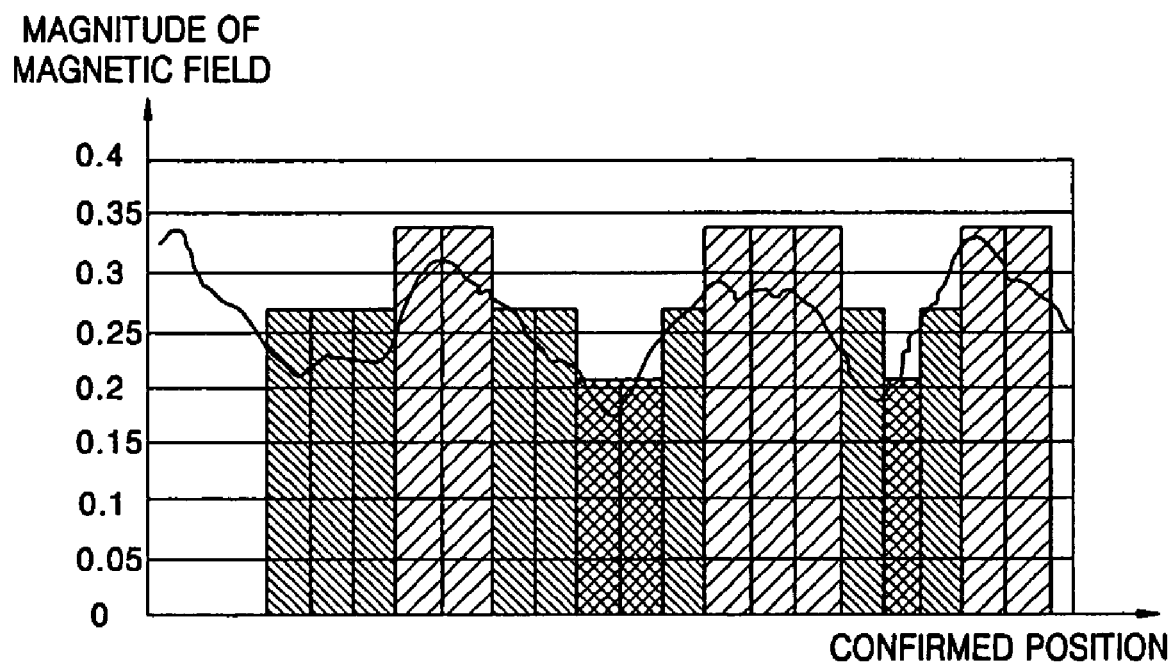
FIG. 11 is a graph showing the comparison between the measured magnitude of the magnetic field and the observed magnitude of the magnetic field.

FIG. 11 is a graph showing the comparison between the measured magnitude of the magnetic field and the observed magnitude of the magnetic field. In the graph, a horizontal axis indicates the confirmed position of the mobile body while a vertical axis indicates the magnitude of a magnetic field.

While the mobile body moves in a one directional space, the position of the mobile body is estimated. When the magnitude of the magnetic field is measured at the estimated position, the graph of FIG. 9 can be obtained. When the magnitude of the magnetic field on the magnetic field map corresponding to each estimated position used to obtain the graph of FIG. 9 is observed, the graph of FIG. 10 can be obtained. The graph of FIG. 11 is obtained by overlapping the graph of FIG. 9 and the graph of FIG. 10.

As shown in FIG. 11, since the measured magnitude of the magnetic field closely matches the observed magnitude of the magnetic field, the probability P' of Equation 1 increases. This means that the estimated position of the mobile body is highly likely to be an actual position of the mobile body.

As a result, at least one of the possibility of the mobile body existing at the estimated position and the possibility of the mobile body maintaining the present direction can be confirmed through at least one of the adjusted probability as shown in Equation 1 and the adjusted probability as shown in Equation 2.

The apparatus for generating a magnetic field map and embodiments according to the present invention, and the structures and operations thereof, are described below with reference to the accompanying drawings.

Figure 12:
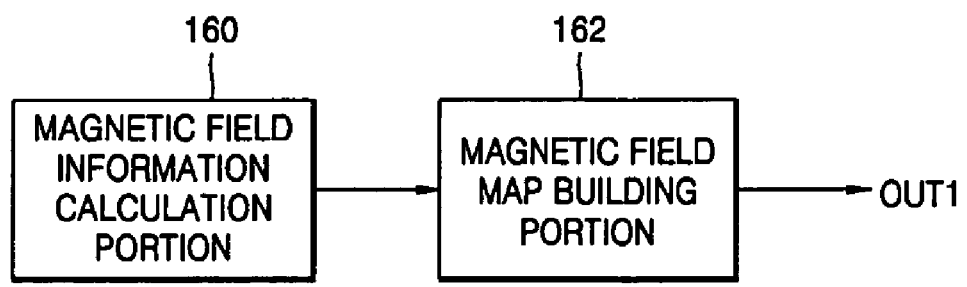
FIG. 12 is a block diagram of an apparatus for generating a magnetic field map according to an embodiment of the present invention.

FIG. 12 is a block diagram of an apparatus for generating a magnetic field map according to an embodiment of the present invention. Referring to FIG. 12, the apparatus for generating a magnetic field map according to an embodiment of the present invention includes a magnetic field information calculation portion 160 and a magnetic field map building portion 162. The apparatus for generating a magnetic field map shown in FIG. 12 can perform the method of generating a magnetic field map shown in FIG. 1.

To execute Step 10 shown in FIG. 1, the magnetic field information calculation portion 160 calculates magnetic field information that is information on the magnetic field affecting the mobile body, for each position of the mobile body. To execute Step 12, the magnetic field map building portion 162 builds a magnetic field map according to the magnetic field information for each position of the mobile body input from the magnetic field information calculation portion 160 and outputs the built magnetic field map through an output port OUT1.

Figure 13:
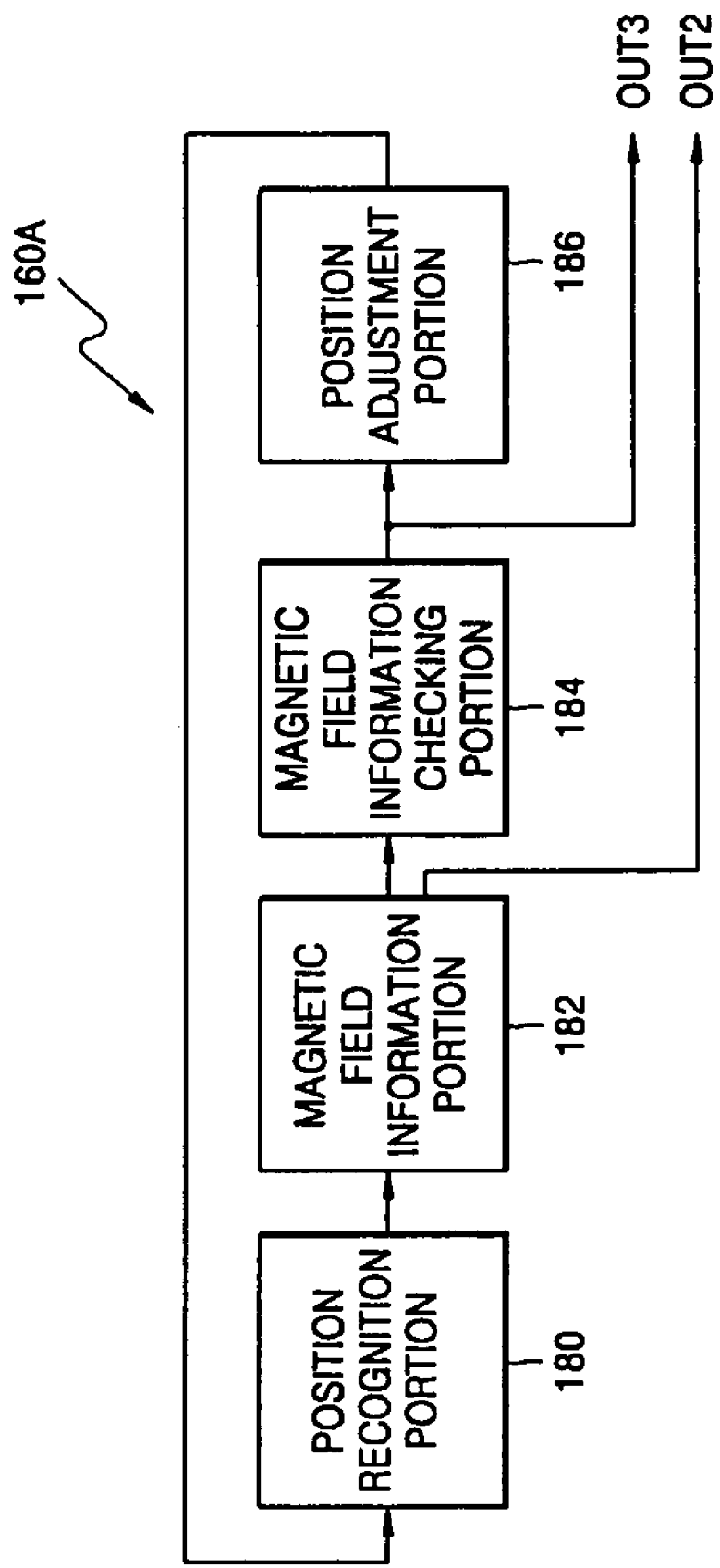
FIG. 13 is a block diagram of an embodiment of the magnetic field information calculation portion shown in FIG. 12.

FIG. 13 is a block diagram of an embodiment (160A) of the magnetic field information calculation portion 160 of FIG. 12, according to the present invention. Referring to FIG. 13, a magnetic field information calculation portion according to an embodiment (160A) of the present invention includes a position recognition portion 180, a magnetic field information portion 182, a magnetic field information checking portion 184, and the position adjustment portion 186.

The magnetic field information calculation portion 160A can execute the steps according to the embodiment 10A shown in FIG. 2.

To execute Step 30, the position recognition portion 180 recognizes the present position of the mobile body and outputs the recognized position to the magnetic field information portion 182.

To execute Step 32, the magnetic field information portion 182 calculates magnetic field information at the present position recognized by the position recognition portion 180, matches the calculated magnetic field information with the recognized present position, stores a matching result, and outputs the matching result to the magnetic field map building portion 162 through an output port OUT2.

To execute Step 34, in response to a signal indicating that the magnetic field information output from the magnetic field information portion 182 is completely stored, the magnetic field information checking portion 184 checks whether all magnetic field information with respect to all positions on the magnetic field map are obtained and outputs a checked result to the position adjustment portion 186 and to the magnetic field map building portion 162 through an output port OUT3. When the magnetic field map building portion 162 recognizes that all magnetic field information are obtained, from the checking result by the magnetic field information checking portion 184, the magnetic field map building portion 162 builds a magnetic field map using magnetic field information being matched with the position input from the magnetic field information portion 182.

To execute Step 36, when the position adjustment portion 186 recognizes through the checking result by the magnetic field information checking portion 184 that all the magnetic field information are not obtained, the position adjustment portion 186 adjusts the present position such that the next target position becomes the present position and outputs an adjusted position to the position recognition portion 180. The position recognition portion 180 recognizes the next target position adjusted by the position adjustment portion 186 as a present position.

Figure 14:
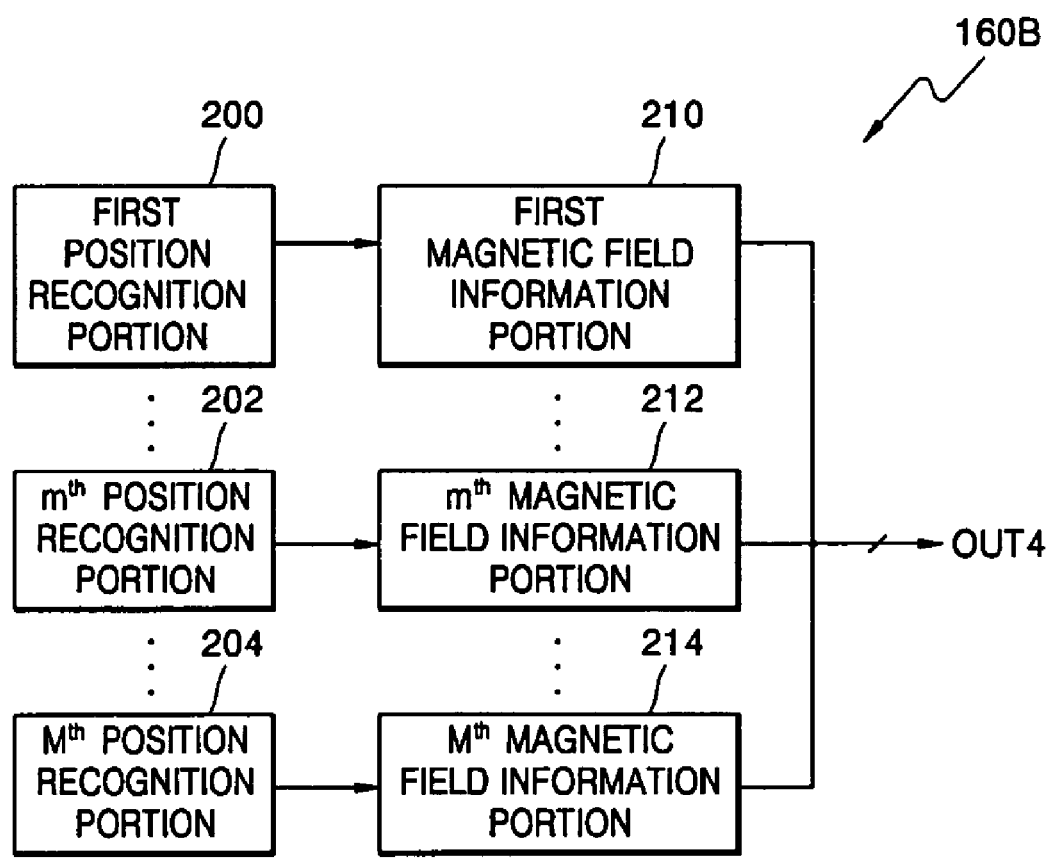
FIG. 14 is a block diagram of another embodiment of the magnetic field information calculation portion shown in FIG. 12.

FIG. 14 is a block diagram of another embodiment (160B) of the magnetic field information calculation portion 160 shown in FIG. 12. Referring to FIG. 14, a magnetic field information calculation portion according to another embodiment (160B) of the present invention includes first, . . . , $m^{th}$, . . . , and $M^{th}$ position recognition portions 200, . . . , 202, . . . , and 204 and first, . . . , $m^{th}$, . . . , and $M^{th}$ magnetic field information portions 210, . . . , 212, . . . , and 214. Here, M denotes the total number of positions that can exist on the magnetic field map and $1 \leq m \leq M$.

The magnetic field information calculation portion according to the present embodiment 160B shown in FIG. 14 can perform the steps according to the embodiment 10B shown in FIG. 3.

To execute Step 50, the first, . . . , the $m^{th}$, . . . , and the $M^{th}$ position recognition portions 200, . . . , 202, . . . , and 204 respectively recognize all positions on the magnetic field map and output recognized results to the first, . . . , the $m^{th}$, . . . , and the $M^{th}$ magnetic field information portions 210, . . . , 212, . . . , and 214.

The first, . . . , the $m^{th}$, . . . , and the $M^{th}$ magnetic field information portions 210, . . . , 212, . . . , and 214 execute Step 52. That is, the $m^{th}$ magnetic field information portion 212 calculates magnetic field information at a position recognized by the m$^{th}$ position recognition portion 202, stores the calculated magnetic field information by matching the same with the position, and outputs stored results to the magnetic field map building portion 162 through an output port OUT4.

As described above, the magnetic field information calculation portion according to the embodiment 160A shown in FIG. 13 obtains magnetic field information on the positions existing on the magnetic field map one by one. In contrast, the magnetic field information calculation portion according to the embodiment 160B shown in FIG. 14 obtains all magnetic field information on the positions existing on the magnetic field map at a time.

Figure 15:
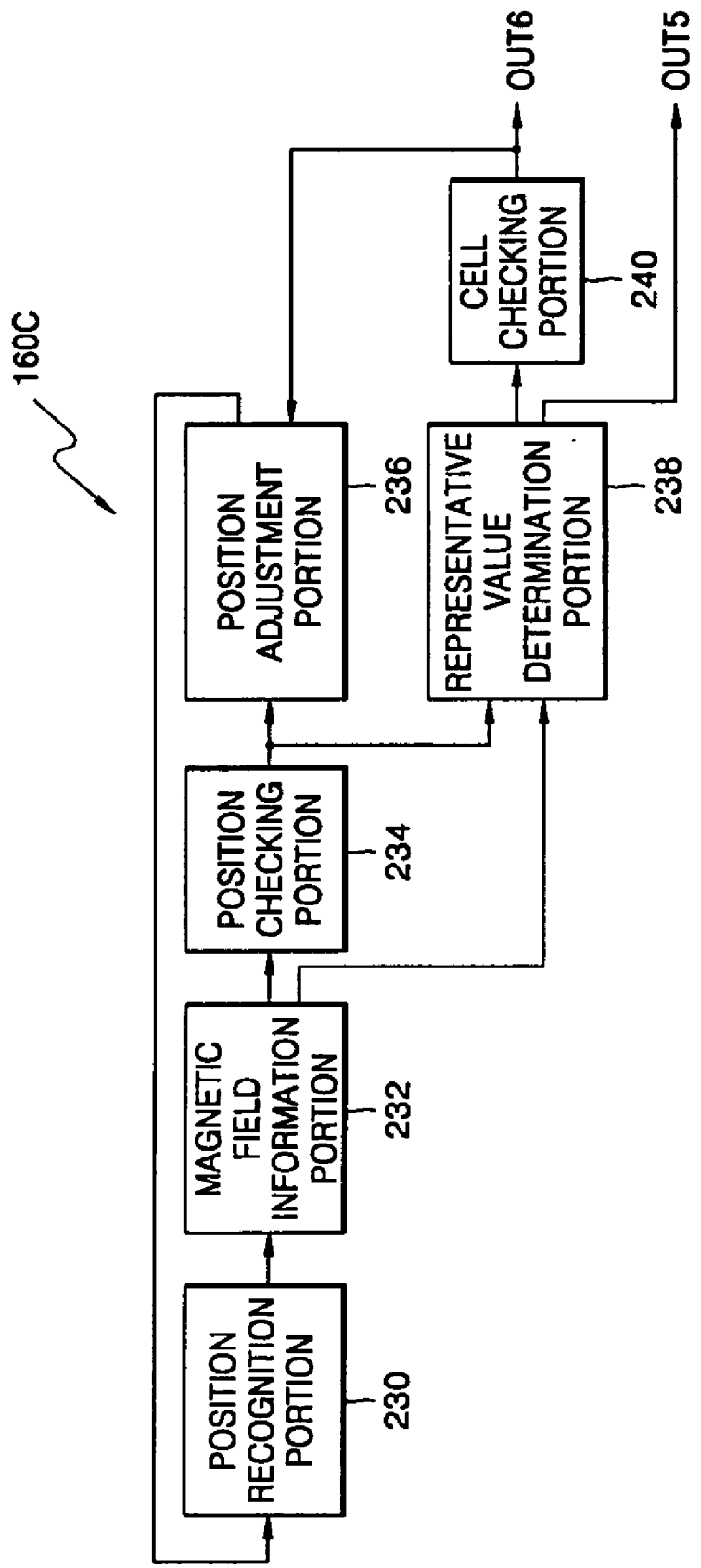
FIG. 15 is a block diagram of yet another embodiment of the magnetic field information calculation portion shown in FIG. 12.

FIG. 15 is a block diagram of yet another embodiment (160C) of the magnetic field information calculation portion 160 shown in FIG. 12. Referring to FIG. 15, a magnetic field information calculation portion according to yet another embodiment (160C) of the present invention includes a position recognition portion 230, a magnetic field information portion 232, a position checking portion 234, a position adjustment portion 236, a representative value determination portion 238, a cell checking portion 240. The magnetic field information calculation portion according to yet another embodiment 160C of the present invention can perform the steps according to the embodiment 10C shown in FIG. 4.

To execute Step 70, the position recognition portion 230 recognizes the present position of the mobile body and the recognized present position is output to the magnetic field information portion 232.

To execute Step 72, the magnetic field information portion 232 calculates magnetic field information at the present position recognized by the position recognition portion 230, stores the calculated magnetic field information, and outputs stored magnetic field information for each position to the representative value determination portion 238.

To execute Step 74, in response to a signal indicating that the magnetic field information output from the magnetic field information portion 232 is completely stored, the position checking portion 234 checks whether the present position and a preceding position recognized just before the present position is recognized exist in the same cell, and outputs a checking result to the position adjustment portion 236 and the representative value determination portion 238.

To execute Step 76, if it is determined from the checking result of the position checking portion 234 that the preceding position and the present position do not exist in the same cell, the representative value determination portion 238 determines the representative value of the magnetic field information of the positions included in the cell, to which the preceding position belongs, using the magnetic field information output from the magnetic field information portion 232, and outputs a determined representative value for each cell to the magnetic field map building portion 162 through an output port OUT5.

To execute Step 78, in response to a signal output from the representative value determination portion 238 indicating that the determination of the representative value is completed, the cell checking portion 240 checks whether all representative values with respect to all cells on the magnetic field map are obtained and outputs a checking result to the position adjustment portion 236 and to the magnetic field map building portion 162 through an output port OUT6. If it is recognized through the checking result of the cell checking portion 240 that all representative values are obtained, the magnetic field map building portion 162 builds a magnetic field map by the representative value for each cell output from the representative value determination portion 138.

To execute Step 80, if it is recognized through a checking result output from the position checking portion 234 that the preceding position and the present position exist in the same cell, the position adjustment portion 236 adjusts the present position such that the next target position becomes the present position and outputs an adjusted position to the position recognition portion 230. Also, if it is recognized through the checking result of the cell checking portion 240 that all the representative values are not obtained, the position adjustment portion 236 adjusts the present position such that the next target position becomes the present position and outputs an adjusted position to the position recognition portion 230. The position recognition portion 230 recognizes the next target position adjusted by the position adjustment portion 236 as the present position.

Figure 16:
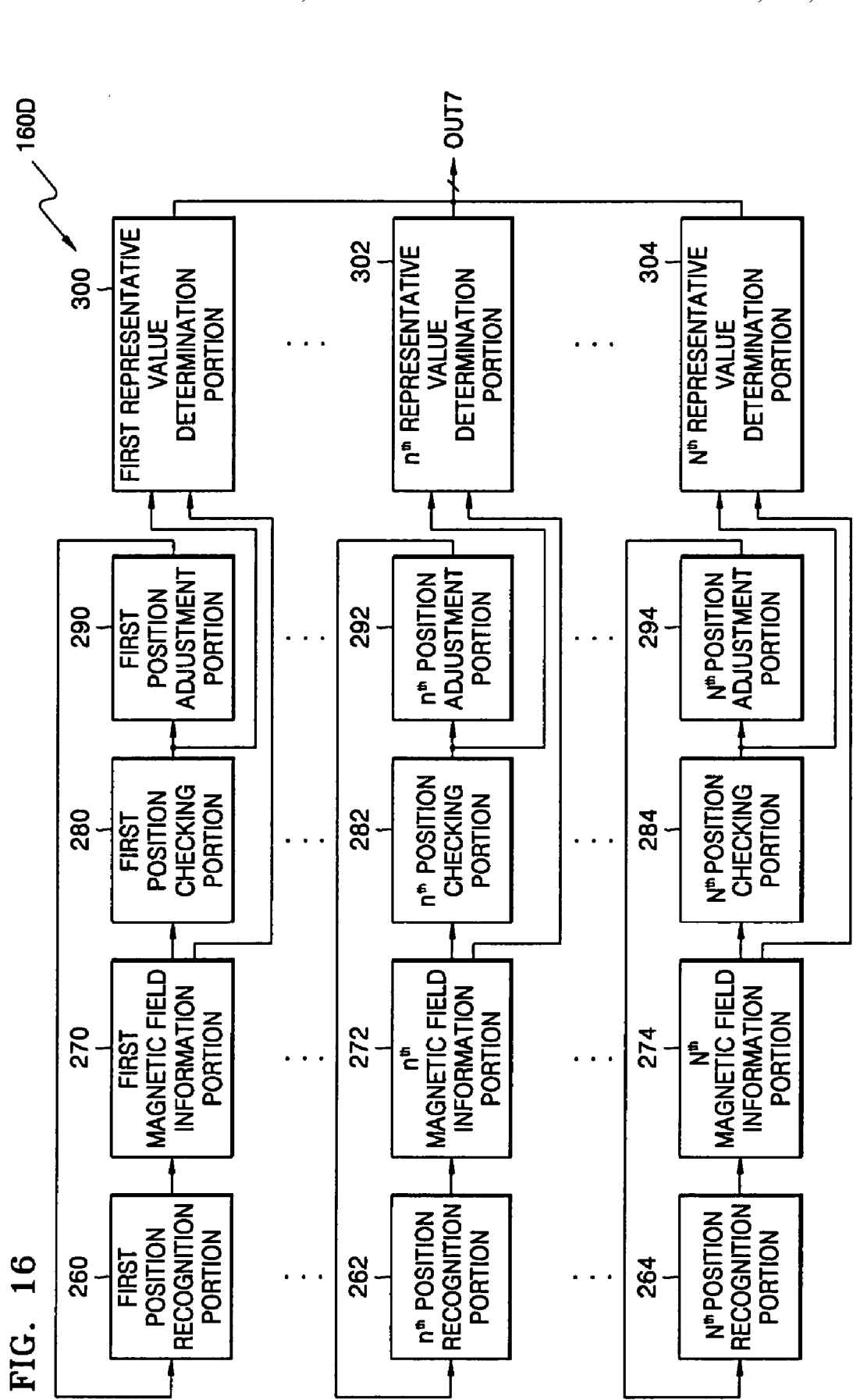
FIG. 16 is a block diagram of still yet another embodiment of the magnetic field information calculation portion shown in FIG. 12.

FIG. 16 is a block diagram of still yet another embodiment (160D) of the magnetic field information calculation portion 160 shown in FIG. 12. Referring to FIG. 16, a magnetic field information calculation portion according to still yet another embodiment (160D) of the present invention includes first, ..., n$^{th}$, ..., and N$^{th}$ position recognition portions 260, ..., 262, ..., and 264, first, ..., n$^{th}$, ..., and N$^{th}$ magnetic field information portions 270, ..., 272, ..., and 274, first, ..., n$^{th}$, ..., and N$^{th}$ position checking portions 280, ..., 282, ..., and 284, first, ..., n$^{th}$, ..., and N$^{th}$ position adjustment portions 290, ..., 292, ..., and 294, and first, ..., n$^{th}$, ..., and N$^{th}$ representative value determination portions 300, ..., 302, ..., and 304. Here, N denotes the total number of cells that can exist on the magnetic field map and $1 \leq n \leq N$.

The magnetic field information calculation portion 160D shown in FIG. 16 can perform the steps according to the embodiment 10D shown in FIG. 6.

The n$_{th}$ position recognition portion 262, the n$_{th}$ magnetic field information portion 272, the n$^{th}$ position checking portion 282, the n$^{th}$ position adjustment portion 292, and the n$^{th}$ representative value determination portion 302 operate to obtain a representative value of magnetic field information of the n$^{th}$ cell among the N cells existing on the magnetic field map.

To execute Step 100, the first, ..., n$^{th}$, ..., and N$^{th}$ position recognition portions 260, ..., 262, ..., and 264 recognize the present positions of the N-numbered mobile bodies.

The first, ..., n$^{th}$, ..., and N$^{th}$ magnetic field information portions 270, ..., 272, ..., and 274 execute Step 102. That is, the n$^{th}$ magnetic field information portion 272 calculates magnetic field information at the present position recognized by the n$^{th}$ position recognition portion 262, stores a result of calculation, and outputs the stored magnetic field information to the n$^{th}$ representative value determination portion 302.

The first, ..., n$^{th}$, ..., and N$^{th}$ position checking portions 280, ..., 282, ..., and 284 execute Step 104. That is, in response to a signal indicating that storing the magnetic field information output from the n$^{th}$ magnetic field information portion 272 is completed, the n$^{th}$ position checking portion 282 checks whether the preceding position recognized just before the present position is recognized and the present position exist in the same cell and outputs a checking result to the n$^{th}$ position adjustment portion 292 and the n$^{th}$ representative value determination portion 302.

The first, ..., n$^{th}$, ..., and N$^{th}$ representative value determination portions 300, ..., 302, ..., and 304 execute Step 106. That is, if it is recognized from the result of checking by the $n^{th}$ position checking portion 282 that the preceding position and the present position do not exist in the same cell, the $n^{th}$ representative value determination portion 302 determines a representative value of the magnetic field information of the positions included in the cell to which the preceding position belongs, using the magnetic field information output from the $n^{th}$ magnetic field information portion 272, and outputs a determined representative value through an output port OUT7 to the magnetic field map building portion 162. The magnetic field map building portion 162 builds a magnetic field map using the representative value for each cell output from the first, ..., $n^{th}$, ..., and $N^{th}$ representative value determination portions 300, ..., 302, ..., and 304.

The first, ..., $n^{th}$, ..., and $N^{th}$ position adjustment portions 290, ..., 292, ..., and 294 execute Step 108. That is, if it is recognized from the result of checking by the $n^{th}$ position checking portion 282 that the preceding position and the present position are included in the same cell, the $n^{th}$ position adjustment portion 292 adjusts the present position such that the next target position becomes the present position and outputs an adjusted position as the $n^{th}$ position recognition portion 262. The $n^{th}$ position recognition portion 262 recognizes the next target position adjusted by the $n^{th}$ position adjustment portion 292 as the present position.

As described above, when the magnetic field map is divided into a plurality of cells, the magnetic field information calculation portion 160C shown in FIG. 15 obtain the representative values of the cells one by one. In contrast, the magnetic field information calculation portion 160D shown in FIG. 16 obtain the representative values of the cells at a time.

The structure and operation of an embodiment of an apparatus for checking pose of a mobile body using a magnetic field map according to an embodiment of the present invention are described below with reference to the accompanying drawings.

Figure 17:
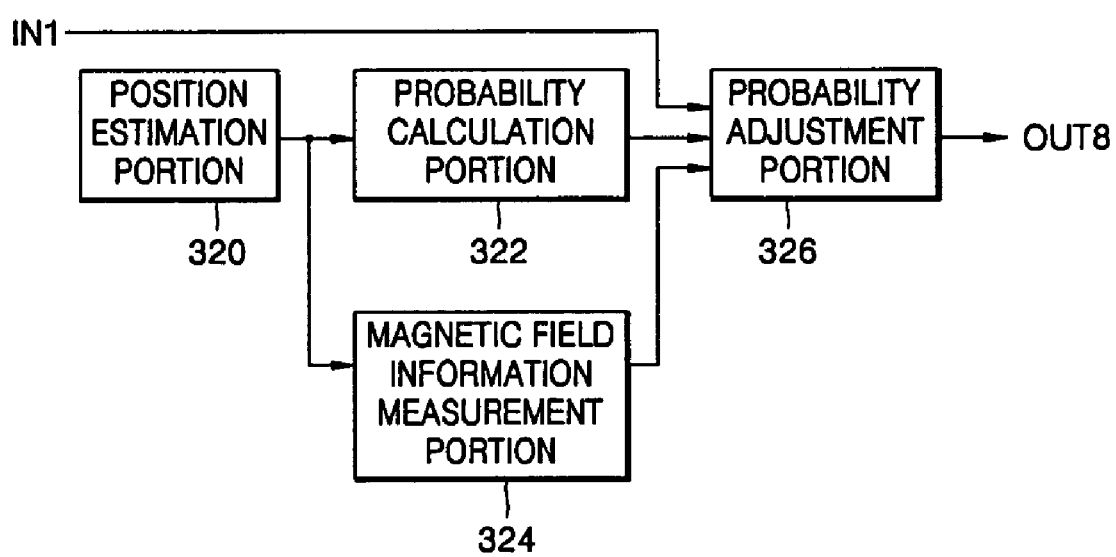
FIG. 17 is a block diagram of an embodiment of an apparatus for checking pose of a mobile body using a magnetic field map according to an embodiment of the present invention.

FIG. 17 is a block diagram of an embodiment of an apparatus for checking pose of a mobile body using a magnetic field map according to an embodiment of the present invention. Referring to FIG. 17, the apparatus includes a position estimation portion 320, a probability calculation portion 322, a magnetic field information measurement portion 324, and a probability adjustment portion 326.

The apparatus for checking pose shown in FIG. 17 performs the method of checking pose shown in FIG. 7.

To execute Step 120, the position estimation portion 320 estimates the position of the mobile body and outputs an estimated position to the probability calculation portion 322 and the magnetic field information measurement portion 324.

According to embodiments of the present invention, when the present position recognized by each of the position recognition portions 180, 200, ..., 202, ..., 204, 230, 260, ..., 262, ..., and 264 shown in FIGS. 13, 14, 15, and 16, respectively, is estimated, or the position estimation portion 320 shown in FIG. 17 estimates the position of the mobile body, a camera, an ultrasonic sensor, a gyro sensor, a odometer, a laser scanner, or an infrared ray scanner can be used.

To execute Step 122, the probability calculation portion 322 calculates the probability P of pose of the mobile body at the estimated position output from the position estimation portion 320 and outputs a calculated probability P to the probability adjustment portion 326.

The magnetic field information measurement portion 324 and the probability adjustment portion 326 execute Step 124. That is, the magnetic field information measurement portion 324 measures magnetic field information at the estimated position output from the position estimation portion 320 and outputs the measured magnetic field information to the probability adjustment portion 326. The probability adjustment portion 326 adjusts the probability P output from the probability calculation portion 322, using the magnetic field information expected at the position estimated on the magnetic field map received through an input port IN1 and actually measured magnetic field information output from the magnetic field information measurement portion 324, and outputs an adjusted probability P' through an output port OUT8. Here, as described above, the pose of the mobile body can be checked through the adjusted probability P' output through the output port OUT8.

FIG. 18 is a block diagram of an embodiment (326A) of the probability adjustment portion 326 shown in FIG. 17. Referring to FIG. 18, a probability adjustment portion according to an embodiment (326A) of the present invention includes a difference and absolute value calculation portion 340, a sum portion 342, a division portion 344, and a multiplication portion 346.

The probability adjustment portion 326A shown in FIG. 18 can execute the steps according to the embodiment (124A) shown in FIG. 8.

To execute Step 140, the difference and absolute value calculation portion 340 calculates a difference between the magnetic field information expected at the estimated present position on the magnetic field map received through an input port IN2 and the measured magnetic field information output from the magnetic field information measurement portion 324 and received through an input port IN3, obtains an absolute value of the calculated difference, and outputs an obtained absolute value to the sum portion 342.

To execute Step 142, the sum portion 342 sums the absolute value of the difference output from the difference and absolute value calculation portion 340 and a first predetermined number E received through an input port IN4, and outputs a sum result to the division portion 344.

To execute Step 144, the division portion 344 divides a second predetermined number K' received through an input portion IN5 by the sum result output from the sum portion 342, and outputs a division result to the multiplication portion 346.

To execute Step 146, the multiplication portion 346 multiplies the division result output from the division portion 344 with the probability P output from the probability calculation portion 322 through an input port IN6, and outputs a multiplication result through an output port OUT9 as the adjusted probability P'.

As described above, according to the method and apparatus for generating a magnetic field map and the method and apparatus for checking pose of a mobile body using the same according to embodiments of the present invention, information on a magnetic field which have been avoided in the prior art is additionally provided through a magnetic field map. The pose of a mobile body can be statistically checked by the probability obtained using the difference between the magnetic field information observed from the magnetic field map and the actually measured magnetic field information. Although the pose of the mobile body is estimated using a camera that is sensitive to an illumination state where the mobile body is placed, the pose of the mobile body can be relatively accurately checked using the magnetic field map obtained in a situation regardless of illumination, with being less affected by the illumination state where the mobile body is placed. Thus, the pose of the mobile body can be checked with reliability.

What is claimed is:

1. A method of generating a magnetic field map, comprising:
obtaining magnetic field information, the magnetic field information being information on a magnetic field affecting a mobile body, for each position of the mobile body;
building the magnetic field map based on the magnetic field information for each position of the mobile body; and
outputting the magnetic field map,
wherein the obtaining of the magnetic field information comprises:
recognizing a present position of the mobile body;
obtaining the magnetic field information at the recognized present position, matching the obtained magnetic field information and the present position, and storing a matching result;
determining whether the magnetic field information is obtained for all positions on the magnetic field map and, if it is determined that the magnetic field information is obtained with respect to all positions, proceeding to the building of the magnetic field map; and
if it is determined that the magnetic field information is not obtained with respect to all positions, adjusting the present position such that a next target position becomes the present position and proceeding to the recognizing of the present position of the mobile body,
wherein, in the recognizing of the present position of the mobile body, the next target position is recognized as the present position after adjusting the present position such that the next target position becomes the present position.

2. The method as claimed in claim 1, wherein, in recognizing the present position of the mobile body, the present position of the mobile body is estimated and the estimated present position is recognized.

3. The method as claimed in claim 1, wherein, in recognizing the present position of the mobile body, the present position of the mobile body is given in advance and the given present position is recognized.

4. The method as claimed in claim 1, wherein the next target position is determined by an active Markov location method.

5. The method as claimed in claim 1, wherein the next target position is determined by a partially observable Markov decision process.

6. A method of generating a magnetic field map, comprising:
obtaining magnetic field information, the magnetic field information being information on a magnetic field affecting a mobile body, for each position of the mobile body;
building the magnetic field map based on the magnetic field information for each position of the mobile body; and
outputting the magnetic field map,
wherein the obtaining of the magnetic field information comprises:
recognizing each of all positions on the magnetic field map; and
obtaining the magnetic field information at each of the recognized positions, matching the obtained magnetic field information with the recognized position and storing a matching result, and proceeding to the building of the magnetic field map.

7. A method of generating a magnetic field map, comprising:
obtaining magnetic field information, the magnetic field information being information on a magnetic field affecting a mobile body, for each position of the mobile body;
building the magnetic field map based on the magnetic field information for each position of the mobile body; and
outputting the magnetic field map,
wherein the obtaining of the magnetic field information comprises:
recognizing a present position of the mobile body;
obtaining and storing the magnetic field information at the present recognized position;
determining whether a preceding position being recognized just before the present position is recognized and the present position exist in a same cell;
if it is determined that the present position and the preceding position exist in the same cell, moving the mobile body to a next target position and proceeding to the recognizing of the present position of the mobile body;
if it is determined that the present position and the preceding position do not exist in the same cell, determining a representative value of the magnetic field information of positions belonging to a cell to which the preceding position belongs; and
determining whether the representative values are obtained with respect to all cells on the magnetic field map and, if it is determined that the representative values are obtained with respect to all cells, proceeding to the building of the magnetic field map, and if it is determined that representative values are not obtained with respect to all cells, proceeding to the moving of the mobile body to the next target position,
wherein each cell includes one or more positions the magnetic field map is built based on the representative value for each cell, and, after moving the mobile body to the next target position, the next target position is regarded as the present position.

8. The method as claimed in claim 7, wherein the representative value of each cell corresponds to an average of the magnetic field information of the positions included in each cell.

9. The method as claimed in claim 7, wherein, when the magnetic field information is divided into a plurality of sections, the representative value is a corresponding section.

10. A method of generating a magnetic field map, comprising:
obtaining magnetic field information, the magnetic field information being information on a magnetic field affecting a mobile body, for each position of the mobile body;
building the magnetic field map based on the magnetic field information for each position of the mobile body; and
outputting the magnetic field map, wherein the obtaining of the magnetic field information comprises:
  recognizing present positions of mobile bodies, the mobile bodies existing as many as a number of cells included in the magnetic filed map;
  obtaining and storing the magnetic field information at each of the present recognized positions;
  determining whether a preceding position, the preceding position being recognized just before the present position is recognized, and the present position exist in a same cell;
  if it is determined that the present position and the preceding position exist in the same cell, adjusting the present position such that a next target position of each mobile body becomes the present position and proceeding to the recognizing of the present positions of mobile bodies; and
  if it is determined that the present position and the preceding position do not exist in the same cell, determining a representative value of the magnetic field information of positions belonging to a cell to which the preceding position belongs and proceeding to the building of the magnetic field map,
  wherein each cell includes one or more positions, the magnetic field map is built based on the representative value for each cell, and, after adjusting the present position such that the next target position of each mobile body becomes the present position, the next target position is regarded as the present position.

11. A method of generating a magnetic field map, comprising:
  obtaining magnetic field information, the magnetic field information being information on a magnetic field affecting a mobile body, for each position of the mobile body;
  building the magnetic field map based on the magnetic field information for each position of the mobile body; and
  outputting the magnetic field map,
  wherein the magnetic field information includes at least one of a magnitude of the magnetic field and a direction of a magnetic north.

12. A method of checking pose of a mobile body using a magnetic field map, comprising:
  obtaining magnetic field information, the magnetic field information being information on a magnetic field affecting a mobile body, for each position of the mobile body;
  building the magnetic field map based on the magnetic field information for each position of the mobile body;
  after building the magnetic field map, estimating a position of the mobile body;
  obtaining a probability of pose of the mobile body existing at the estimated position;
  adjusting the probability using both the magnetic field information expected at the estimated position on the magnetic field map and the magnetic field information actually measured at the estimated position; and
  outputting the adjusted probability,
  wherein the probability of the pose corresponds to at least one of a probability of the mobile body existing at the estimated position and a probability of the mobile body having an estimated direction, the pose of the mobile body is checked through the adjusted probability.

13. The method as claimed in claim 12, wherein at least one of the estimating of the position of the mobile body and the obtaining of the probability of pose of the mobile body at the estimated position is performed using a Kalman filer.

14. The method as claimed in claim 12, wherein at least one of the estimating of the position of the mobile body and the obtaining of the probability of pose of the mobile body at the estimated position is performed using a Markov localization method.

15. The method as claimed in claim 12, wherein at least one of the estimating of the position of the mobile body and the obtaining of the probability of pose of the mobile body at the estimated position is performed using a particle filter.

16. The method as claimed in claim 12, wherein at least one of the estimating of the position of the mobile body and the obtaining of the probability of pose of the mobile body at the estimated position is performed using a multiple hypothesis localization method.

17. The method as claimed in claim 12, wherein the magnetic field information is at least one of a magnitude of the magnetic field and a direction of a magnetic north.

18. The method as claimed in claim 12, wherein the adjusting of the probability comprises:
  obtaining an absolute value of a difference between the expected magnetic field information and the measured magnetic field information;
  summing the absolute value of the difference and a first predetermined number;
  dividing a second predetermined number by the summing result; and
  multiplying the division result and the probability and determining a multiplication result as the adjusted probability,
  wherein the first predetermined number is preset such that the summing result becomes a positive number.

19. An apparatus for generating a magnetic field map, comprising:
  a magnetic field information calculation portion calculating magnetic field information, the magnetic filed information being information on a magnetic field affecting a mobile body, for each position of the mobile body; and
  a magnetic field map building portion building the magnetic field map based on the magnetic field information for each position of the mobile body output from the magnetic field information calculation portion,
  wherein the magnetic field information calculation portion comprises:
    a position recognition portion recognizing a present position of the mobile body;
    a magnetic field information portion calculating the magnetic field information at the present position recognized by the position recognition portion, matching the present position and the calculated magnetic field information, and storing a matching result;
    a magnetic field information checking portion checking whether the magnetic field information is obtained with respect to all positions on the magnetic field map and outputting a check result; and
    a position adjustment portion adjusting the present position such that a next target position becomes the present position and outputting an adjusted position to the position recognition portion, in response to the checking result of the magnetic filed information checking portion,
    wherein the position recognition portion recognizes the next target position adjusted by the position adjustment portion as the present position, and the magnetic field map building portion builds the magnetic field map in response to the checking result of the magnetic field information checking portion.

20. An apparatus for generating a magnetic field map, comprising:
a magnetic field information calculation portion calculating magnetic field information, the magnetic filed information being information on a magnetic field affecting a mobile body, for each position of the mobile body; and
a magnetic field map building portion building the magnetic field map based on the magnetic field information for each position of the mobile body output from the magnetic field information calculation portion,
wherein the magnetic field information calculation portion comprises:
first through $M^{th}$ position recognition portions recognizing each of all positions on the magnetic field map, wherein M denotes the number of all positions; and
first through $M^{th}$ magnetic field information portions, wherein $m^{th}$ magnetic field information portion calculates the magnetic field information at the position recognized by $m^{th}$ position recognition portion, in which $1 \leq m \leq M$, and the calculated magnetic field information is matched with the recognized position and a matching result is stored.

21. An apparatus for generating a magnetic field map, comprising:
a magnetic field information calculation portion calculating magnetic field information, the magnetic filed information being information on a magnetic field affecting a mobile body, for each position of the mobile body; and
a magnetic field map building portion building the magnetic field map based on the magnetic field information for each position of the mobile body output from the magnetic field information calculation portion,
wherein the magnetic field information calculation portion comprises:
a position recognition portion recognizing a present position of the mobile body;
a magnetic field information portion calculating the magnetic field information at the present position recognized by the position recognition portion and storing the calculated magnetic field information;
a position checking portion determining whether a preceding position, the preceding position being recognized just before the present position is recognized, and the present position exist in the same cell, and outputting a checking result;
a position adjustment portion adjusting the present position such that a next target position becomes the present position and outputting an adjusted position to the position recognition portion, in response to the checking result of the position checking portion;
a representative value determination portion determining a representative value of the magnetic field information of positions belonging to a cell to which the preceding position belongs, using the stored magnetic field information, in response to the checking result of the position checking portion; and
a cell checking portion checking whether the representative values are obtained with respect to all cells on the magnetic field map and outputting a checking result,
wherein each cell includes one or more positions, the position adjustment portion adjusts the present position in response to the checking result of the cell checking portion, the magnetic field map building portion builds the magnetic field map based on the representative value for each cell in response to the checking result of the cell checking portion, and the position recognition portion recognizes the next target position adjusted by the position adjustment portion as the present position.

22. An apparatus for generating a magnetic field map, comprising:
a magnetic field information calculation portion calculating magnetic field information, the magnetic filed information being information on a magnetic field affecting a mobile body, for each position of the mobile body; and
a magnetic field map building portion building the magnetic field map based on the magnetic field information for each position of the mobile body output from the magnetic field information calculation portion,
wherein the magnetic field information calculation portion comprises:
first through $N^{th}$ position recognition portions recognizing present positions of N mobile bodies, wherein N denotes the number of all cells;
first through $N^{th}$ magnetic field information portions;
first through $N^{th}$ position checking portions;
first through $N^{th}$ position adjustment portions; and
first through $N^{th}$ representative value determination portions,
wherein an $n^{th}$ magnetic field information portion calculates the magnetic field information at the present position recognized by an $n^{th}$ position recognition portion and stores the calculated magnetic field information, in which $1 \leq n \leq N$,
an $n^{th}$ position checking portion checks whether a preceding position, the preceding position being recognized just before the present position is recognized, and the present position exist in the same cell,
an $n^{th}$ position adjustment portion adjusts the present position such that a next target position becomes the present position and outputs an adjusted position to an $n^{th}$ position recognition portion, in response to the checking result of the $n^{th}$ position checking portion,
an $n^{th}$ representative value determination portion determines a representative value of magnetic field information of positions belonging to a cell to which the preceding position belongs, using the magnetic field information stored in an $n^{th}$ magnetic field information portion, in response to the checking result of the $n^{th}$ position checking portion,
wherein each cell includes one or more positions, the magnetic field map building portion builds the magnetic field map based on the representative value for each cell, and the $n^{th}$ position recognition portion recognizes the next target position adjusted by the $n^{th}$ position adjustment portion as the present position.

23. An apparatus for checking a pose of a mobile body, comprising:
a magnetic field information calculation portion calculating magnetic field information, the magnetic filed information being information on a magnetic field affecting a mobile body, for each position of the mobile body;

a magnetic field map building portion building the magnetic field map based on the magnetic field information for each position of the mobile body output from the magnetic field information calculation portion;

a position estimation portion estimating a position of the mobile body;

a probability calculation portion calculating a probability of the pose of the mobile body existing at the estimated position;

a magnetic field information measurement portion measuring the magnetic field information at the estimated position; and a probability adjustment portion adjusting the probability using magnetic field information expected at the estimated position on the magnetic field map and actually measured magnetic field information output from the magnetic field information measurement portion, wherein the probability of pose corresponds to at least one of a probability of the mobile body existing at the estimated position and a probability of the mobile body having an estimated direction, and the pose of the mobile body is checked through the adjusted probability.

24. The apparatus as claimed in claim 23, wherein the probability adjustment portion comprises:

a difference and absolute value calculation portion calculating an absolute value of a difference between the observed magnetic field information and the measured magnetic field information;

a sum portion summing the absolute value of the difference and a first predetermined number;

a division portion dividing a second predetermined number by a summing result; and a multiplication portion multiplying a division result with the probability and outputting a multiplication result as the adjusted probability, wherein the first predetermined number is preset such that the summing result of the sum portion becomes a positive number.

25. The apparatus as claimed in claim 23, wherein the position estimation portion includes a camera, an ultrasonic sensor, a gyro sensor, an odometer, a laser scanner, or an infrared scanner which estimates the position of the mobile body.

* * * * *